US011279248B2

(12) United States Patent
Kim

(10) Patent No.: US 11,279,248 B2
(45) Date of Patent: Mar. 22, 2022

(54) POWER SUPPLY DEVICE

(71) Applicant: LG INNOTEK CO., LTD., Seoul (KR)

(72) Inventor: Yang Hyun Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 375 days.

(21) Appl. No.: 16/496,848

(22) PCT Filed: Mar. 20, 2018

(86) PCT No.: PCT/KR2018/003220
§ 371 (c)(1),
(2) Date: Sep. 23, 2019

(87) PCT Pub. No.: WO2018/186609
PCT Pub. Date: Oct. 11, 2018

(65) Prior Publication Data
US 2020/0079233 A1 Mar. 12, 2020

(30) Foreign Application Priority Data
Apr. 3, 2017 (KR) ........................ 10-2017-0043031

(51) Int. Cl.
*B60L 53/22* (2019.01)
*B60L 50/64* (2019.01)
*B60L 53/55* (2019.01)
*B60L 53/16* (2019.01)
*B60L 50/40* (2019.01)
(Continued)

(52) U.S. Cl.
CPC ............... *B60L 53/22* (2019.02); *B60L 50/00* (2019.02); *B60L 50/40* (2019.02); *B60L 50/50* (2019.02); *B60L 50/64* (2019.02); *B60L 53/16* (2019.02); *B60L 53/55* (2019.02); *B60L 53/62* (2019.02); *H02J 7/00* (2013.01); *H03H 7/0115* (2013.01);
(Continued)

(58) Field of Classification Search
CPC ....................................................... B60L 53/22
USPC ........................................................... 320/109
See application file for complete search history.

(56) References Cited

U.S. PATENT DOCUMENTS 3,972,020 A * 7/1976 Carroll ..................... G01V 1/22
367/45
6,163,470 A * 12/2000 Chavez .................. H02H 9/001
323/908
(Continued)

FOREIGN PATENT DOCUMENTS

KR 10-2005-0078537 A 8/2005
KR 10-2013-0078386 A 7/2013
(Continued)

*Primary Examiner* — Jerry D Robbins
(74) *Attorney, Agent, or Firm* — Birch, Stewart, Kolasch & Birch, LLP

(57) ABSTRACT

The present invention relates to a power supply device for supplying power, from a battery provided at an electric vehicle, to various types of components, the power supply device enabling current sensing to be performed so as to confirm that an electric vehicle charging facility and an electric vehicle are connected to each other through a connector, and reducing electro-magnetic interference (EMI) noise. The objective of the power supply device of the present invention is to: provide a stable voltage to electric vehicle application components; and reduce the EMI noise according to battery charging, self-switching of the power supply device and the like.

18 Claims, 10 Drawing Sheets

(51) Int. Cl.

| | |
|---|---|
| ***H02J 7/00*** | (2006.01) |
| ***H03H 7/01*** | (2006.01) |
| ***H03H 7/06*** | (2006.01) |
| ***B60L 50/50*** | (2019.01) |
| ***B60L 50/00*** | (2019.01) |
| ***B60L 53/62*** | (2019.01) |

(52) U.S. Cl.
CPC ............ *H03H 7/06* (2013.01); *B60L 2200/00* (2013.01); *B60L 2270/147* (2013.01)

(56) References Cited

U.S. PATENT DOCUMENTS

| | | | | |
|---|---|---|---|---|
| 2008/0174255 | A1* | 7/2008 | Schnetzka .......... | H05K 7/20936 318/12 |
| 2010/0019862 | A1* | 1/2010 | Feng ...................... | H03H 7/427 333/181 |
| 2012/0014143 | A1* | 1/2012 | Schueneman ......... | H02M 1/126 363/40 |
| 2013/0169212 | A1 | 7/2013 | Sun et al. | |
| 2015/0171817 | A1* | 6/2015 | Sun ......................... | B60L 53/20 307/9.1 |

FOREIGN PATENT DOCUMENTS

| | | | |
|---|---|---|---|
| KR | 10-2015-0071574 | A | 6/2015 |
| KR | 10-2016-0017513 | A | 2/2016 |
| WO | WO 2017/010750 | A1 | 1/2017 |

* cited by examiner

POWER SUPPLY DEVICE

CROSS REFERENCE TO RELATED APPLICATIONS

This application is the National Phase of PCT International Application No. PCT/KR2018/003220, filed on Mar. 20, 2018, which claims priority under 35 U.S.C. 119(a) to Patent Application No. 10-2017-0043031, filed in the Republic of Korea on Apr. 3, 2017, all of which are hereby expressly incorporated by reference into the present application.

TECHNICAL FIELD

The present invention relates to a power supply device for supplying power, from a battery provided in an electric vehicle, to various types of components, and more particularly, to a power supply device enabling current sensing to be performed so as to confirm that an electric vehicle charging facility and an electric vehicle are connected to each other through a connector, and reducing electro-magnetic interference (EMI) noise.

BACKGROUND ART

General vehicles obtain energy necessary for driving from combustion of fossil fuel, but electric vehicles obtain energy necessary for driving from electric energy. Therefore, such an electric vehicle secures driving power by charging a battery with electric energy.

It is necessary to supply stable voltage not only for a motor of the electric vehicle but also an electric vehicle communication controller (EVCC) from the battery mounted in the electric vehicle.

In this instance, it is also necessary to supply stable voltage to automotive parts of the vehicle and reduce electro-magnetic interference (EMI) noise.

Furthermore, it is also necessary to enable current sensing to be performed so as to confirm that an electric vehicle charging facility and the electric vehicle are connected to each other through a connector and to use a second capacitor for reducing electro-magnetic interference (EMI) noise.

Moreover, it is necessary to realize a two-point ground including a PE ground and a chassis ground insulated from each other on a circuit board on which the power supply device is mounted and to connect the second capacitor with the chassis ground in order to release the EMI noise to the chassis ground.

DISCLOSURE

Technical Problem

Accordingly, the present invention has been made in view of the above-mentioned problems occurring in the prior art, and it is an object of the present invention to provide a power supply device, which can provide a stable voltage to electric vehicle components and reduce the electro-magnetic interference (EMI) noise according to battery charging, self-switching of the power supply device and the like.

It is another object of the present invention to provide a power supply device, which can enable current sensing to be performed so as to confirm that an electric vehicle charging facility and the electric vehicle are connected to each other through a connector and can use a second capacitor for reducing electro-magnetic interference (EMI) noise.

It is a further object of the present invention to provide a power supply device, which can realize a two-point ground including a PE ground and a chassis ground insulated from each other on a circuit board on which the power supply device is mounted and to connect the second capacitor with the chassis ground in order to release the EMI noise to the chassis ground.

Meanwhile, technical objects to be achieved by the present invention are not limited to the above-described objects and other technical objects that have not been described will be evidently understood by those skilled in the art from the following description.

Technical Solution

To accomplish the above object, according to the present invention, there is provided a power supply device including: a common mode (CM) filter unit having a first capacitor and a second capacitor, wherein one end of the first capacitor is connected to a positive (+) terminal of a battery and the other end is connected with a potential earth (PE) ground of an electric vehicle supply equipment (EVSE) of an electric vehicle, and one end of the second capacitor is connected to the other end of the first capacitor and the other end of the second capacitor is connected with a chassis ground grounded to a chassis of the electric vehicle; and a differential mode (DM) filter unit having an inductor and a third capacitor, wherein an end of the third capacitor is connected with the PE ground.

Moreover, the first capacitor includes a first X capacitor and a second X capacitor. The second capacitor includes a first Y capacitor of which one end is connected to one end of the first X capacitor and the other end is connected with the chassis ground and a second Y capacitor of which one end is connected to the other end of the second X capacitor and the other end is connected with the chassis ground. The CM filter unit includes: a CM core located between the first X capacitor and the second X capacitor; and an RC filter of which one end is connected to the other end of the first Y capacitor and the other end is connected with the chassis ground.

Furthermore, the common mode filter unit further includes a DC block capacitor of which one end is connected to the positive (+) terminal of the battery and the other end is connected with the PE ground.

The common mode filter unit goes by the way of a converter and is connected with the DM filter.

The inductor of the differential mode (DM) filter unit is connected to an output terminal of the converter, and the other end of the third capacitor is connected to the inductor.

Additionally, the second X capacitor is spaced apart from the converter at an interval of 1 mm to 5 mm.

In addition, the power supply device further includes a second converter connected with the DM filter, and a positive (+) line of an output terminal of the second converter is spaced apart from the chassis ground and/or the PE ground more than 0.3 mm.

Moreover, the power supply device further includes: a second layer having a power line; a ground layer having a PE ground and a chassis ground; a first penetration electrode for connecting the PE ground and the second layer with each other; a second penetration electrode for connecting the chassis ground and the second layer with each other; and a circuit board having a chassis electrode for connecting the chassis ground and a chassis case with each other, wherein one area of the second layer connected with the PE ground through the first penetration electrode and another area of the second layer connected with the chassis ground are insulated electrically, wherein the common mode filter unit and the differential mode filter unit are arranged on the second layer.

Furthermore, the ground layer is one layer.

Additionally, the ground layer includes a third layer having the PE ground and a fourth layer having the chassis ground.

In another aspect of the present invention there is provided an electric vehicle communication controller (EVCC) for charging a battery of an electric vehicle including: a connector connected with a charging station of the electric vehicle; and a power supply circuit for supplying actuating power to the EVCC, wherein the connector includes: a power input port; a control pilot (CP) port for receiving a control pilot signal; and a potential earth (PE) port connected with a potential earth (PE) ground of the charging station of the electric vehicle, wherein the power supply circuit includes: a power input terminal to which an electric signal is applied; a first filter for removing common mode noise of the electric signal; and a second filter for removing differential mode noise of the electric signal, and wherein the first filter is connected with the chassis ground of the electric vehicle, and the second filter is connected with the potential earth (PE) ground.

The electric vehicle communication controller (EVCC) further includes a converter for converting voltage of an electric signal outputted from the first filter, wherein the electric signal is inputted to the second filter.

The converter includes an input terminal connected with the first filter and an output terminal connected with the second filter, wherein at least one choke inductor is connected to the output terminal, and the choke inductor is spaced apart from the PE ground and/or the chassis ground more than 0.3 mm.

The first filter includes a second capacitor of which one end is connected with the PE ground and the other end is connected with the chassis ground.

The first filter further includes an RC filter of which one end is connected with the second capacitor and the other end is connected with the chassis ground.

Advantageous Effects

As described above, the power supply device according to the present invention can provide a stable voltage to electric vehicle components and reduce the electro-magnetic interference (EMI) noise according to battery charging, self-switching of the power supply device and the like.

The power supply device according to the present invention can enable current sensing to be performed so as to confirm that an electric vehicle charging facility and the electric vehicle are connected to each other through a connector and can use a second capacitor for reducing electro-magnetic interference (EMI) noise.

The power supply device according to the present invention can provide a power supply device, which can realize a two-point ground including a PE ground and a chassis ground insulated from each other on a circuit board on which the power supply device is mounted and to connect the second capacitor with the chassis ground in order to release the EMI noise to the chassis ground.

The effects of the present invention are not limited to the above-mentioned effects and further effects not described above will be clearly understood by those skilled in the art.

MODE FOR INVENTION

Figure 1:
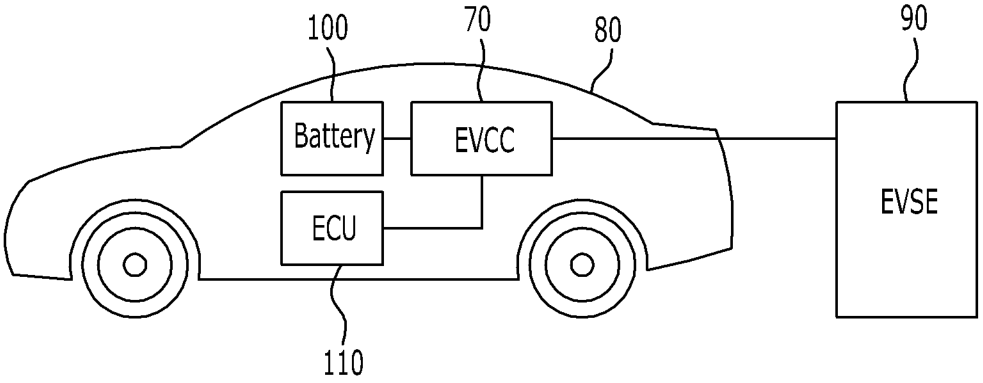
FIG. 1 is a view showing an electric vehicle and an electric vehicle supply equipment.

The details of present invention can be explained by explaining desirable embodiments of present invention by referring the attached drawing. It will be understood that components of the desirable embodiments may have varied combination within the embodiments unless stated otherwise or unless there is a contradiction. Moreover, embodiments of the present invention may be implemented in several different forms and are not limited to the embodiments described herein.

In drawings, parts irrelevant to description are omitted in order to clearly explain embodiments of the present invention. Similar parts are denoted by similar reference numerals throughout this specification. Also, when a certain part "includes" a certain component, other components are not excluded unless explicitly described otherwise, and other components may in fact be included.

In the entire specification of the present invention, when a part is referred to as being "connected" to another part, this includes "direct connection" and "electrical connection" via an intervening part. Furthermore, in the entire specification, a signal means the quantity of electricity of voltage or current.

An element described in the specification means a "block configured to change or plug-in a hardware system or a software system". That is, the element means a unit or a block for carrying out a specific function in hardware or software.

FIG. 1 is a view showing an electric vehicle (EV) 80 and an electric vehicle supply equipment (EVSE).

The electric vehicle 80 may be charged from the EVSE which is an electric vehicle charging facility 90. A charging cable connected to the EVSE may be connected to an inlet of the electric vehicle 80. The electric vehicle 80 may be connected with the electric vehicle charging facility 90 in various ways, and a charging mode of the electric vehicle 80 is decided on the basis of the connection method.

The electric vehicle charging facility 90 is a facility to supply AC or DC, may be arranged in a charging station or in a house, and may be realized to be portable. That is, the electric vehicle charging facility 90 may be used with a supply, an AC supply, a DC supply, a socket-outlet, and the likes.

An electric vehicle communication controller (EVCC) 70 is included in the electric vehicle 80 and is connected with an electronic control unit (ECU) 110 and a battery 100. The ECU 110 controls various parts of the vehicle, such as an engine, an automatic transmission, an ABS, and the likes. If the electric vehicle 80 is connected with the EVSE, electric energy is charged to the battery 100 through the EVCC 70.

Figure 2:
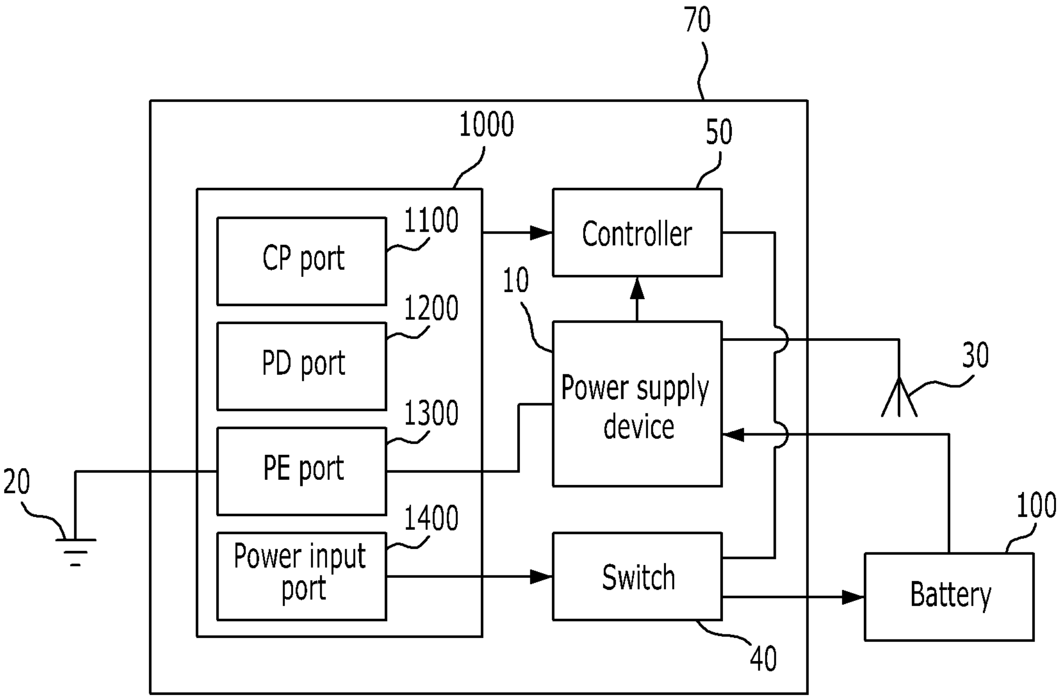
FIG. 2 is a block diagram showing a detailed configuration of an electric vehicle communication controller and a battery.

FIG. 2 is a block diagram showing a detailed configuration of the EVCC 70 and the battery 100.

The EVCC 70 for charging the battery 100 of the electric vehicle 80 further includes: a connector 1000 connected with a charging station of the electric vehicle 80; and a power supply circuit 10 for supplying actuating power to the EVCC 70. Moreover, the EVCC 70 further includes a controller 50.

The connector 1000 includes: a power input port 1400; a control pilot (CP) port 1100 for receiving a control pilot signal; and a potential earth (PE) port 1300 connected with a potential earth (PE) ground of the charging station of the electric vehicle 80. Furthermore, the connector 1000 further includes a proximity detection (PD) port 1200.

燫葪e CP port 1100 is a port for receiving a control pilot (CP) signal transferred through a charging cable connected to the EVSE. The PD port 1200 is a port for sensing whether or not the connector 1000 approaches the EVSE. The PE port 1300 is a port connected with a ground of the EVSE.

The controller 50 controls charging of the battery 100. The electric controller 50 may include a pilot function (PF) logic for treating a pilot function received through the CP port 110. Additionally, the controller 50 may include a proximity detection (PD) logic for detecting insertion of the connector 1000 of the EVSE using a signal received through the PD port 1200.

The controller 50 controls a switch (SW) 40 connected with the power input port 1400 when receiving the signal received through the CP port 1100 and the signal received through the PD port 1200. The switch 40 may be a relay switch 40. The battery 100 goes by way of the switch 40 and receives charging power from the EVSE.

The power supply device 10 converts voltage receiving from the charged battery 100 into voltage for components included in the EVCC 70. Referring to FIG. 2, the controller 50 receives electric power through the power supply device 10 from the battery. That is, the power supply device 10 supplies main voltage for a micro controller unit (MCU) or core voltage for the micro controller unit (MCU).

The EVCC 70 may further include a controller area network (CAN) transmitter. That is, the power supply device 10 supplies voltage for the controller area network transmitter. The power supply device 10 according to the present invention is connected with a PE ground through the PE port 1300. Moreover, the power supply device 10 is also connected with a chassis ground 30.

Figure 3:
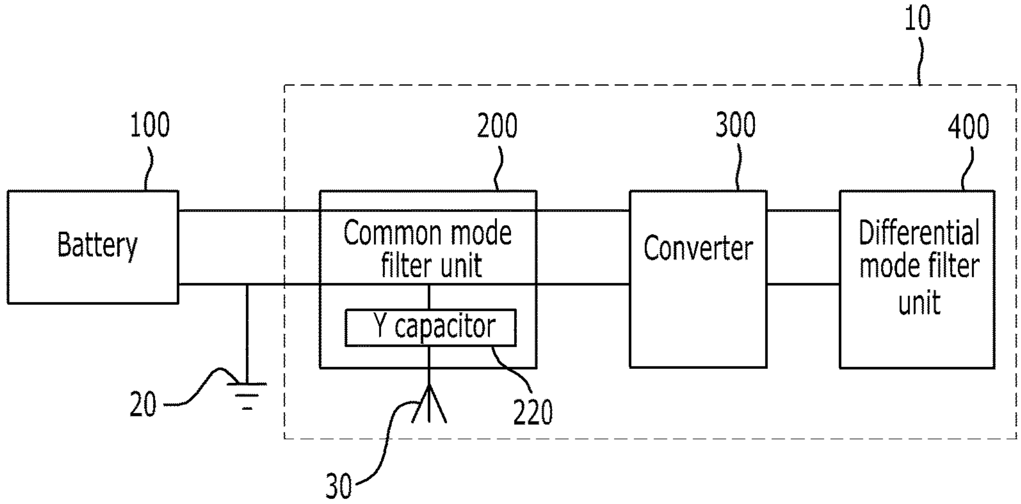
FIG. 3 is a block diagram showing a detailed configuration of a power supply device and a battery.

FIG. 3 is a block diagram showing a detailed configuration of the power supply device and the battery. The power supply device 10 includes a common mode filter unit, a converter 300, and a differential mode filter unit. As shown in FIG. 3, the battery 100, the converter 300, and the differential mode filter unit are grounded with the PE ground 20. The common mode filter unit is grounded with all of the PE ground 20 and the chassis ground 30. An end of a second capacitor 220 of the common mode filter unit is connected with the PE ground 20 and the other end is connected with the chassis ground 30.

While electric power is being supplied from the battery 100 of the electric vehicle 80 through the MCU of the EVCC 70, electro-magnetic interference (EMI) noise is generated. Electro-magnetic interference (EMI) means that electromagnetic waves emitted from an electronic device interrupt electromagnetic reception of another device, and is divided into conducted emission (CE) and radiated emission (RE).

The conducted emission (CE) means that electromagnetic waves are transmitted through a medium, such as a signal line or a power line. The radiated emission (RE) is electromagnetic noise radiated and transmitted through the air.

In order to reduce the EMI noise, the power supply device 10 necessarily includes a filter. That is, the power supply device 10 which converts voltage received from the battery 100 into voltage requiring load like the MCU of the EVCC 70 and supplies the converted voltage includes a filter for reducing the EMI noise.

In this instance, if the power supply device 10 includes the second capacitor 220, it can reduce the EMI noise. If the second capacitor 220 is connected with the PE ground, which is a ground of the electric vehicle charging facility 90, the EVCC 70 cannot exactly sense a current value from the electric vehicle charging facility 90.

In order to confirm that the electric vehicle charging facility 90 and the electric vehicle are connected with each other through the connector 1000, the EVCC 70 senses a current value from the electric vehicle charging facility 90. In this instance, if the second capacitor 220 is connected with the PE ground, the EVCC 70 cannot exactly sense the current value due to equivalent serial resistance (ESR) of the second capacitor 220.

Finally, in order to exactly sense the current value from the electric vehicle charging facility 90 and reduce the EMI noise, the power supply device 10 includes the second capacitor 220 of which one end is connected with the chassis ground.

Figure 4:
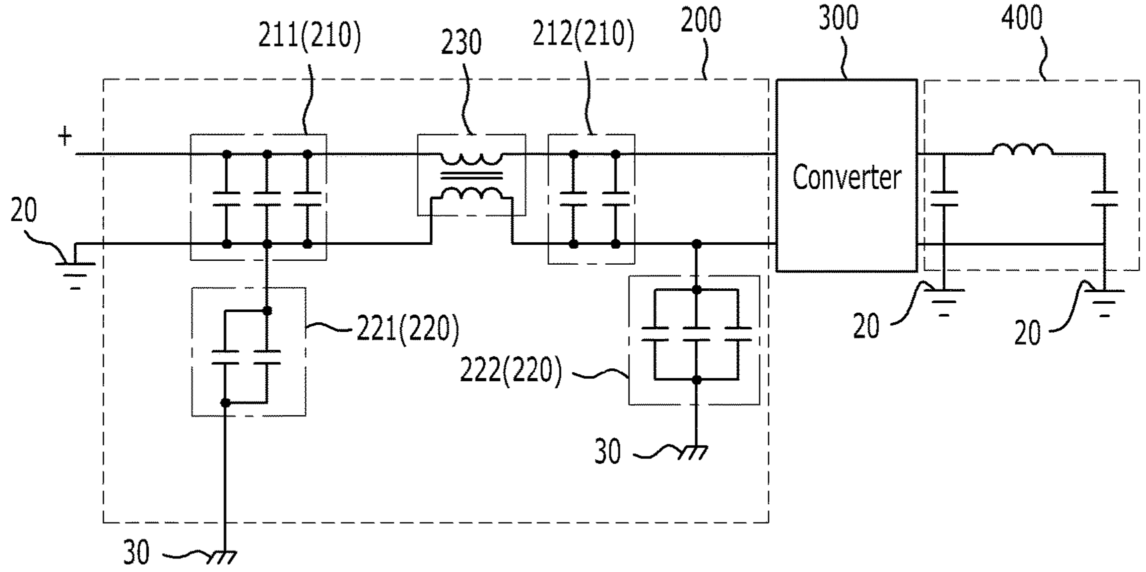
FIG. 4 is a block diagram showing a detailed configuration of the power supply device according to a first preferred embodiment of the present invention.

FIG. 4 is a block diagram showing a detailed configuration of the power supply device according to a first preferred embodiment of the present invention.

The power supply device 10 includes: a common mode (CM) filter unit having a first capacitor 210 and a second capacitor 220, wherein one end of the first capacitor 210 is connected to a positive (+) terminal of the battery 100 and the other end is connected with a potential earth (PE) ground of an electric vehicle supply equipment (EVSE) of the electric vehicle 80, and one end of the second capacitor 220 is connected to the other end of the first capacitor 210 and the other end is connected with a chassis ground 30 grounded to a chassis of the electric vehicle 80; and a differential mode (DM) filter unit being a Pi filter and having an inductor and a third capacitor, wherein an end of the third capacitor is connected with the PE ground.

The common mode filter unit includes the first capacitor 210 and the second capacitor 220. The common mode filter unit reduces common mode (CM) noise. The CM noise means that noise flows of the positive terminal and the negative terminal of a power source of the battery 100 go in the same direction.

One end of the first capacitor 210 is connected to the positive terminal of the battery 100, and the other end is connected with the PE ground, which is the ground of the EVSE of the electric vehicle 80.

The first capacitor 210 is a capacitor connected with the positive terminal and the negative terminal (or ground) of the battery 100. A positive (+) line illustrated in FIG. 4 is a line connected with the positive (+) line of the battery (100) and is connected with the end of the first capacity 210. The first capacitor 210 illustrated in FIG. 4 adopts a form that two or three capacitors are connected in parallel, but is not limited to the above.

The first capacitor 210 reduces switching peak noise due to a switching action of the converter 300.

One end of the second capacitor 220 is connected to the other end of the first capacitor 210, and the other end is connected with the chassis ground 30 grounded to the chassis of the electric vehicle 80. The second capacitor 220 is a capacitor connected between a ground and a ground. One end of the second capacitor 220 is connected with the PE ground 20, which is the other end of the first capacitor 210. The other end of the second capacitor 220 is connected with the chassis ground 30. The chassis may be a metallic component included in the vehicle. For instance, the chassis may be a wheel bearing, a driving shaft, a wheel unbalance, a ball joint, a wheel alignment, a link fracture, a damper, or the like.

The first capacitor 210 illustrated in FIG. 4 adopts a form that two or three capacitors are connected in parallel, but is not limited to the above. The second capacitor 220 reduces ground noise. The ground noise is noise existing in the ground.

The differential mode (DM) filter unit includes the inductor and the third capacitor, and the other end of the third capacitor is connected with the PE ground. The differential mode filter unit reduces differential mode noise. The differential mode noise means that noise flows of the positive terminal and the negative terminal of the power source go in the opposite directions from each other.

The differential mode filter unit as shown in FIG. 4 may include a Pi filter. The Pi filter is a filter in which a Pi inductor and a capacitor are combined with each other in a Pi form, but is not limited to the Pi filter form illustrated in FIG. 4. The differential mode filter unit is connected with the PE ground.

Figure 5:
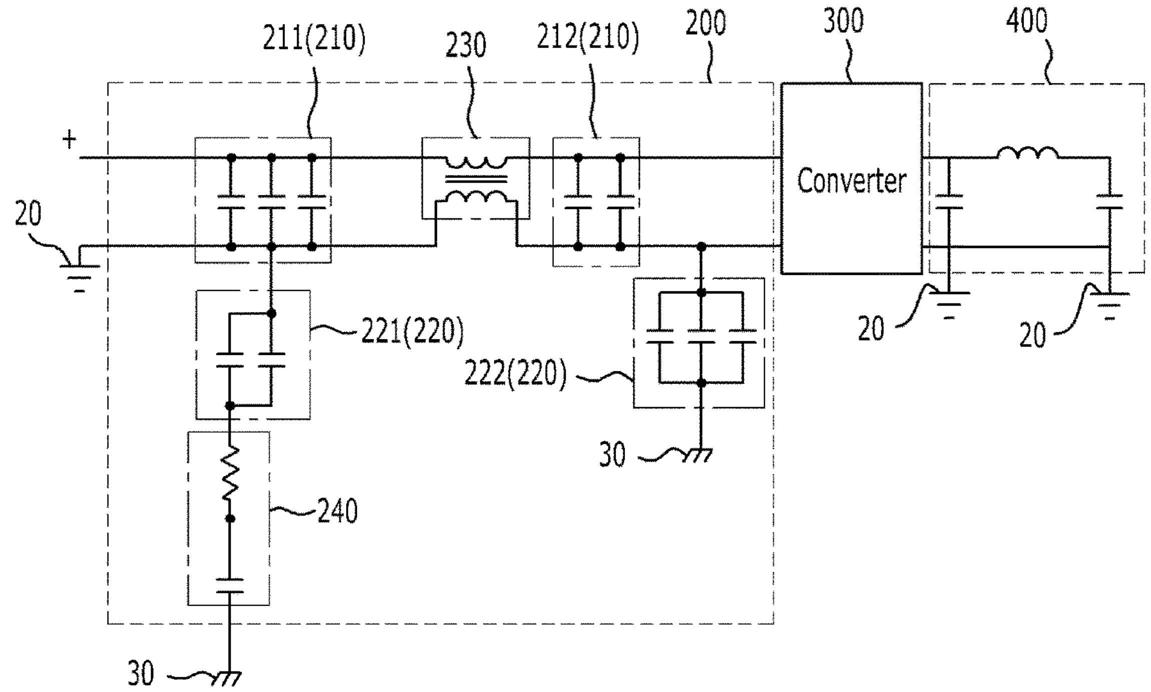
FIG. 5 is a block diagram showing a detailed configuration of the power supply device according to a second preferred embodiment of the present invention.

FIG. 5 is a block diagram showing a detailed configuration of the power supply device according to a second preferred embodiment of the present invention. The power supply device 10 of FIG. 5 further includes an RC filter 240 in addition to the components of the power supply device 10 according to the embodiment of FIG. 4.

The first capacitor 210 includes a first X capacitor 211 (210) and a second X capacitor 212(210), and the second capacitor 220 includes a first Y capacitor 221(220) of which one end is connected to one end of the first X capacitor 211(210) and the other end is connected with the chassis ground 30 and a second Y capacitor 222(220) of which one end is connected to the other end of the second X capacitor 212(210) and the other end is connected with the chassis ground 30. The CM filter unit includes: a CM core located between the first X capacitor 211(210) and the second X capacitor 212(210); and an RC filter of which one end is connected to the other end of the first Y capacitor 221(220) and the other end is connected with the chassis ground 30.

The first capacitor 210 has been described above. The first capacitor 210 includes the first X capacitor 211(210) and the second X capacitor 212(210). The number of the capacitors including the first X capacitor 211(210) and the second X capacitor 212(210) is not limited to the embodiment of FIG. 5. The end of the first X capacitor 211(210) and the end of the second X capacitor 212(210) are connected with the positive end of the battery 100 and the other end of the first X capacitor 211(210) and the other end of the second X capacitor 212(210) are connected with the PE ground 20.

The second capacitor 220 includes the first Y capacitor 221(220) of which one end is connected to one end of the first X capacitor 211(210) and the other end is connected with the chassis ground 30 and the second Y capacitor 222(220) of which one end is connected to the other end of the second X capacitor 212(210) and the other end is connected with the chassis ground 30.

The second capacitor 220 has been described above. The second capacitor 220 includes the first Y capacitor 221(220) and the second Y capacitor 222(2210). The number of the capacitors including the first Y capacitor 221(220) and the second Y capacitor 222(220) is not limited to the embodiment of FIG. 5.

The first Y capacitor 221(220) goes by way of the RC filter 240, which will be described later, and is connected with the chassis ground 30.

The common mode (CM) filter unit further includes the CM core located between the first X capacitor 211(210) and the second X capacitor 212(210). As shown in FIG. 5, the Cm core 230 includes an inductor to reduce ground noise.

The common mode filter unit further includes the RC filter of which one end is connected to the other end of the first Y capacitor 221(220) and the other end is connected with the chassis ground 30. The RC filter 240 includes a resistance and a capacitor. The RC filter 240 emits peak noise and ground noise to the chassis ground 30.

Figure 6A:
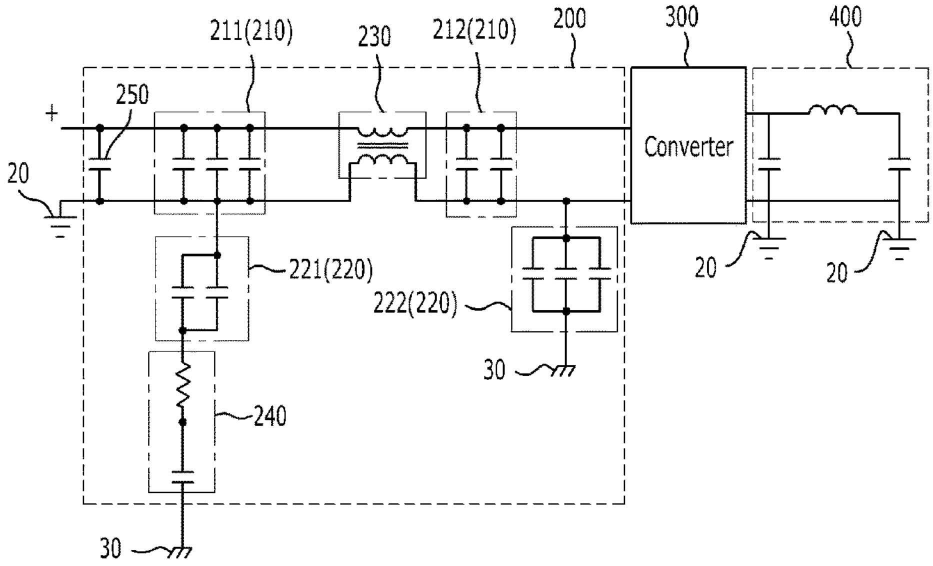
FIG. 6*a* is a block diagram showing a detailed configuration of the power supply device according to a third preferred embodiment of the present invention.

FIG. 6*a* is a block diagram showing a detailed configuration of the power supply device according to a third preferred embodiment of the present invention. The common mode filter unit further includes a DC block capacitor 250 of which one end is connected to the positive terminal of the battery 100 and the other end is connected with the PE ground. In the embodiment illustrated in FIG. 5, the power supply device 10 further includes the DC block capacitor 250.

The DC block capacitor 250 blocks peak current which may be introduced into the battery 100. The peak current may be generated when the electric vehicle 80 and the charging facility of the electric vehicle 80 are connected with each other electrically through the connector 100. Cases that the peak current is generated are not limited to the above embodiment.

Each of the power supply devices 10 according to FIGS. 4 to 6*a* includes the converter 300, and in this instance, the common mode filter unit goes by the way of the converter 300 and is connected with the DM filter.

The converter 300 may be a single ended primary inductor converter or a fly-back converter, but the kind and the number of the converter are not limited.

The second X capacitor 212 is spaced apart from the converter at an interval of 1 mm to 5 mm. In detail, the second X capacitor 212 is spaced apart from the converter at an interval of 1 mm to 3 mm. In order to filter the switching noise generated from the converter, the second X capacitor 212 is necessarily arranged to be close to the converter, namely, is arranged within 3 mm. If the second X capacitor 212 and the converter are arranged too close, a physical contact may be generated. Therefore, the second X capacitor 212 and the converter are arranged more than 1 mm in consideration of reliability in manufacturing.

The inductor of the differential mode (DM) filter unit is connected to an output terminal of the converter, and the other end of the third capacitor is connected to the inductor. As shown in FIGS. 4 to 6*a*, one inductor and the third capacitor are combined with each other in the Pi form.

Figure 6B:
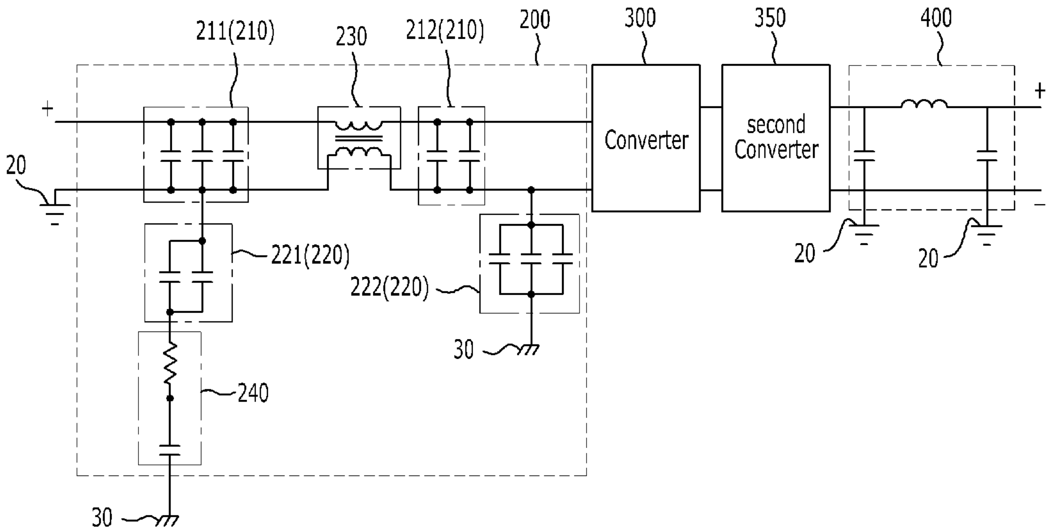
FIG. 6*b* is a block diagram showing a detailed configuration of the power supply device according to a fourth preferred embodiment of the present invention.
Figure 6C:
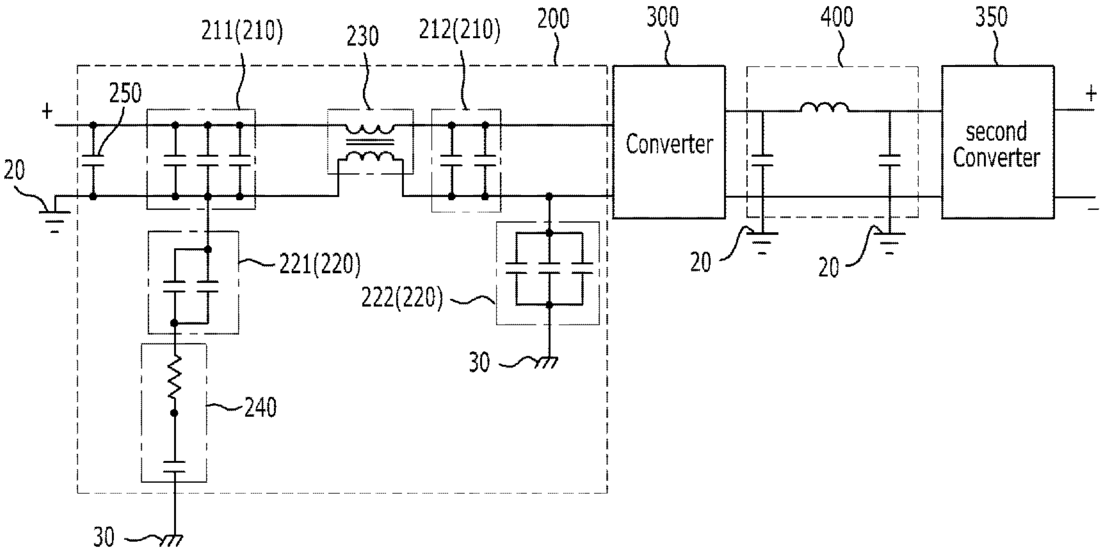
FIG. 6*c* is a block diagram showing a detailed configuration of the power supply device according to a fifth preferred embodiment of the present invention.

FIG. 6*b* is a block diagram showing a detailed configuration of the power supply device according to a fourth preferred embodiment of the present invention. FIG. 6*c* is a block diagram showing a detailed configuration of the power supply device according to a fifth preferred embodiment of the present invention.

The power supply device further includes a second converter connected with the DM filter, a positive (+) line of an output terminal of the second converter is spaced apart from the chassis ground and the PE ground more than 0.1 mm, and preferably, more than 0.3 mm. When the positive (+) line of the second converter is spaced apart from the chassis ground and the PE ground more than 0.3 mm, it can prevent coupling to reduce switch noise caused by switch of the converter or the second converter. Here, the coupling means a phenomenon that signal energies emitted from neighboring lines are directly or indirectly flown into the opposite line.

As shown in FIG. 6*b*, the second converter 320 may be located between the converter 300 and the differential mode (DM) filter unit 400, but is not limited to the above. As shown in FIG. 6*c*, the differential mode filter unit 400 may be located between the converter and the second converter 320.

The second converter 320 converts voltage outputted from the converter 300 and supplies the converted voltage to the CAN transmitter. The positive (+) line of the output terminal of the second converter 320 is spaced apart from the chassis ground and the PE ground more than 0.3 mm.

Figure 7:
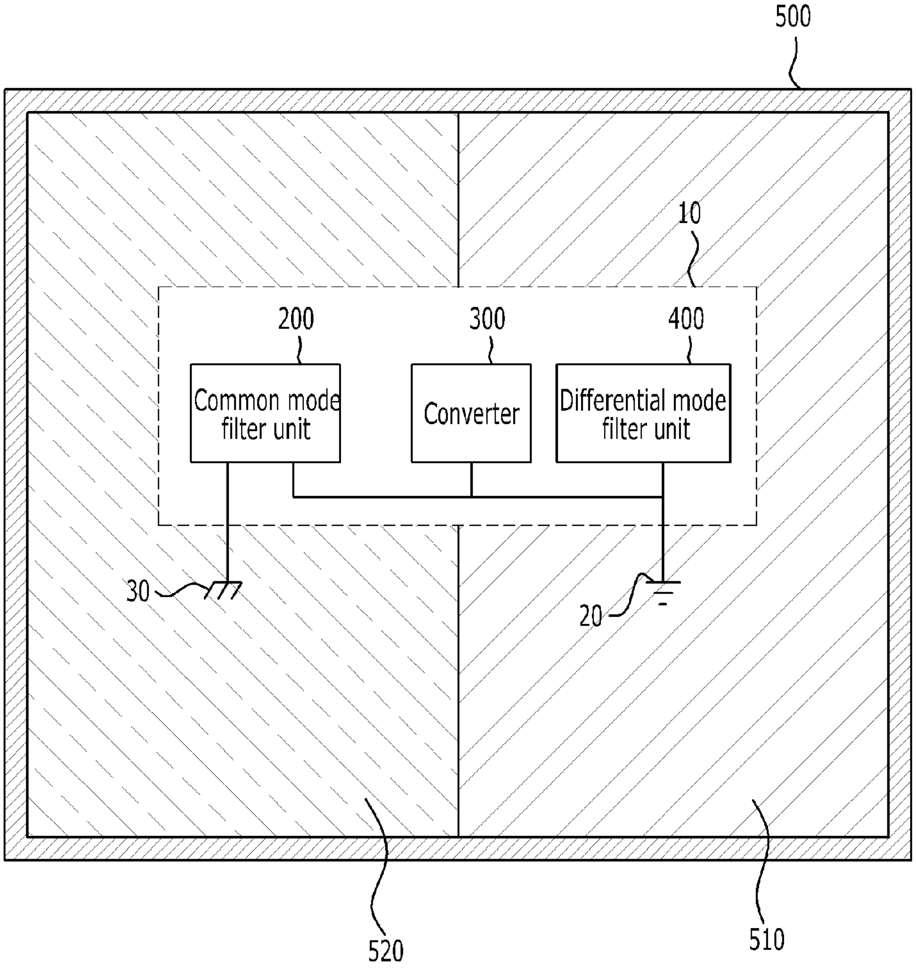
FIG. 7 is a view showing an upper surface of a printed circuit board divided into a chassis ground area and a PP ground area.

FIG. 7 is a view showing an upper surface of a printed circuit board divided into a chassis ground area 520 and a PE ground area 510.

As shown in FIG. 7, an upper surface of the printed circuit board is divided into the chassis ground area 520 and the PE ground area 510. The chassis ground area 520 and the PE ground area 510 of the printed circuit board are electrically insulated.

The components of the power supply device 10 are arranged on the printed circuit board. As described above, the common mode filter unit is connected with the chassis ground 30 through the chassis ground area 520. The common mode filter unit may be directly in contact with the chassis 500 illustrated in FIG. 7 and be connected with the chassis ground 30. Moreover, the common mode filter unit is connected with the PE ground 20 through the PE ground area 510.

The converter 300 and the differential mode filter unit are connected with the PE ground 20 through the PE ground area 510.

The chassis ground area 520 and the PE ground area 510 of the printed circuit board may exist in various forms.

Figure 8:
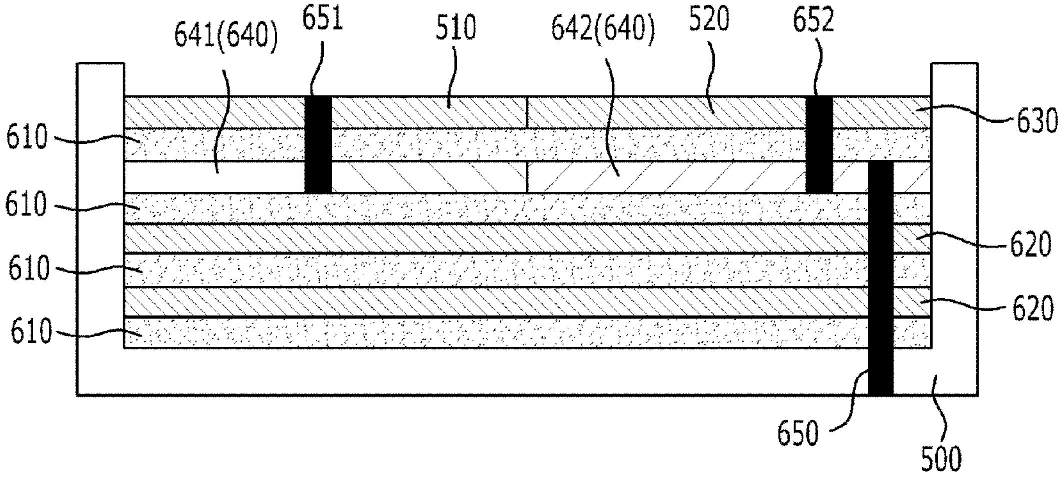
FIG. 8 is a view showing a cut section of a circuit board according to an embodiment of the present invention.

FIG. 8 is a view showing a cut section of a circuit board according to an embodiment of the present invention.

The power supply device 10 further includes: a first layer 620 having a data line; a second layer 630 having a power line; a ground layer 640 having the PE ground 641 and the chassis ground 642; a first penetration electrode 651 for connecting the PE ground 641 and the second layer 630 with each other; a second penetration electrode 652 for connecting the chassis ground 642 and the second layer 630 with each other; and a circuit board having a chassis electrode 650 for connecting the chassis ground 642 and a chassis case with each other, wherein one area of the second layer 630 connected with the PE ground 641 through the first penetration electrode 651 and another area of the second layer 630 connected with the chassis ground 642 are insulated electrically, and the common mode filter unit and the differential mode filter unit are arranged on the second layer 630.

The circuit board includes: a first layer 620 having a data line; a second layer 630 having a power line; a ground layer 640 having the PE ground 641 and the chassis ground 642; a first penetration electrode 651 for connecting the PE ground 641 and the second layer 630 with each other; a second penetration electrode 652 for connecting the chassis ground 642 and the second layer 630 with each other; and a circuit board having a chassis electrode 650 for connecting the chassis ground 642 and a chassis case with each other, wherein one area of the second layer 630 connected with the PE ground 641 through the first penetration electrode 651 and another area of the second layer 630 connected with the chassis ground 642 are insulated electrically.

The circuit board may include a resin-group printed circuit board (PCB) 150, a metal core PCB, a flexible PCB, a ceramic PCB, and an FR-4 board.

The first layer 620 has the data line for transmitting a data signal. Any element existing on the circuit board may send and receive data through the first layer 620.

The second layer 630 has the power line. Any element existing on the circuit board through the power line can send and receive electric power.

The ground layer 640 includes the PE ground 641 and the chassis ground 642. The PE ground 641 and the chassis ground 642 are insulated electrically.

The first penetration electrode 651 connects the second layer 630 with the PE ground 641. The PE ground area 510 may exist on the second layer 630 connected with the PE ground 641 through the first penetration electrode.

The second penetration electrode 652 connects the second layer 630 with the chassis ground 642. The chassis ground area 520 may exist on the second layer connected with the chassis ground 642 through the second penetration electrode 652.

The chassis electrode 650 connects a body-in chassis case of the electric vehicle 80 with the chassis ground 642. The chassis ground 642 is connected with the chassis case to secure a stable grounding area.

The area of the second layer 630 connected with the PE ground 641 through the first penetration electrode 651 and the other area of the second layer 630 connected with the chassis ground 642 are insulated electrically.

The common mode filter unit 200 and the differential mode filter unit 400 are arranged on the second layer 630. As described above, the common mode filter unit 200 is connected with all of the PE ground 641 and the chassis ground 642. The common mode filter unit 200 is connected with all of the area of the second layer 630 connected with the PE ground 641 through the first penetration electrode 651 and the other area of the second layer 630 connected with the chassis ground 642.

As described above, the differential mode filter unit 400 is connected with the PE ground 641. The differential mode filter unit 400 is connected with the area of the second layer 630 connected with the PE ground 641 through the first penetration electrode 651.

An insulation layer 610 is arranged between at least two layers, which are equal to or different from each other among the first layer 620, the second layer 630 and the ground layer 640. The first penetration electrode 651, the second penetration electrode 652, and the chassis electrode 650 penetrate through the insulation layer 610 and electrically connect the two different layers.

The first layer 620 may be arranged below the ground layer 640 in order to minimize emission since generating high frequency noise. The ground layer 640 may serve as a shield to shelter noise emitted from the first layer 620. The second layer 630 may generate low frequency noise, and may be arranged above the ground layer 640.

The ground layer 640 may be arranged between the first layer 620 and the second layer 630. However, the arrangement of the layers is not limited to the above, and may be varied in various ways. The first layer 620 may be plural layers according to a design of a circuit pattern. A surface layer on which an IC chip is directly mounted may be further arranged on the second layer 630.

The chassis electrode 650 has a diameter of 2 cm to 5 cm. The chassis electrode 650, and the first penetration electrode 651 or the second penetration electrode 652 may be arranged at an interval of at least 3 mm to 5 mm. If the chassis electrode 650, and the first penetration electrode 651 or the second penetration electrode 652 are arranged at an interval less than 3 mm to 5 mm, an overcurrent may be not discharged to the outside through the chassis electrode 650 but may be returned to the circuit board through the first penetration electrode 651 or the second penetration electrode 652.

The minimum distance between the chassis electrode 650 and the first penetration electrode 651 or the second penetration electrode 652 may be 0.1 times to 0.25 times of the diameter of the chassis electrode 650.

Referring to FIG. 8, the ground layer is one layer. The PE ground 641 and the chassis ground 642 which are electrically insulated from each other exist on the layer.

Figure 9:
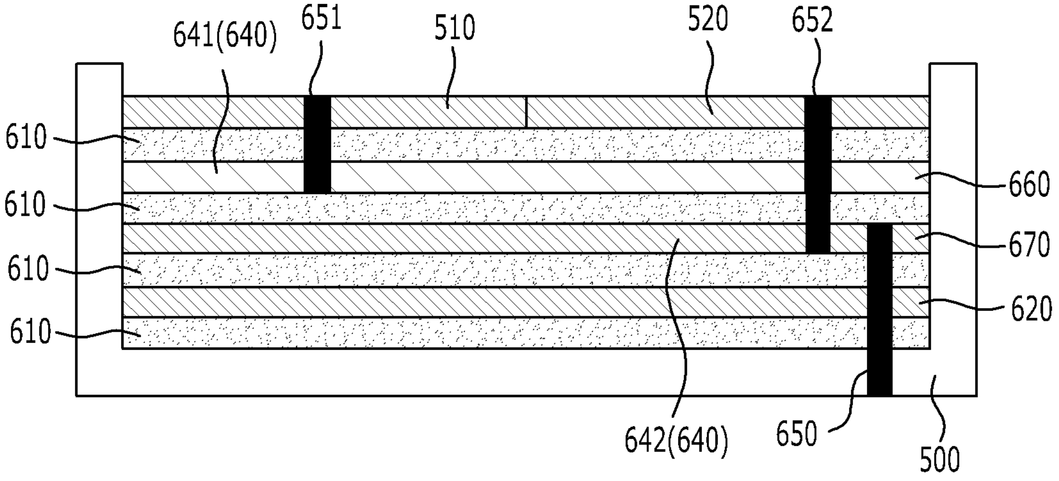
FIG. 9 is a cross sectional view of a circuit board according to another embodiment of the present invention.

FIG. 9 is a cross sectional view of a circuit board according to another embodiment of the present invention.

The ground layer 640 includes: a third layer 660 having the PE ground 641; and a fourth layer 670 having the chassis ground 642. That is, the ground layer 640 includes the third layer 660 and the fourth layer 670 which are different from each other. The two different layers are insulated from each other and include different grounds. One of the grounds is the PE ground 20, and the other is the chassis ground 642.

The EVCC 70 for charging the battery 100 of the electric vehicle 80 includes: a connector 1000 connected with the charging station of the electric vehicle 80; and a power supply circuit 10 for supplying actuating power to the EVCC 70. Moreover, the EVCC 70 further includes a controller 50. The connector 1000 includes: a power input port; a control pilot (CP) port for receiving a control pilot signal; and a potential earth (PE) port connected with a potential earth (PE) ground of the charging station of the electric vehicle 80. The power supply circuit 10 includes: a power input terminal to which an electric signal is applied; a first filter for removing common mode noise of the electric signal; and a second filter for removing differential mode noise of the electric signal. The first filter is connected with the chassis ground of the electric vehicle 80, and the second filter is connected with the potential earth (PE) ground.

The connector 1000, the power supply circuit 10, the power input port, the CP port, and the PE port have been described above. The power supply circuit 10 is the power supply device.

The power input terminal of the power supply circuit 10 to which the electric signal as applied is an input terminal to which electric power is inputted from the battery 100.

The first filter for removing the common mode noise of the electric signal is the common mode filter.

A DC-AC converter for converting voltage of the electric signal outputted from the first filter is the converter 300.

The second filter for removing the differential mode noise of the electric signal which is applied from the power input terminal is the differential mode filter.

The first filter is connected with the chassis ground of the electric vehicle 80, and the second filter is connected with the PE ground. Furthermore, the first filter is also connected with the PE ground.

The EVCC further includes a converter for converting voltage of the electric signal outputted from the first filter, and the electric signal with the converted voltage is inputted to the second filter. The second filter removes the differential mode noise of the electric signal outputted from the converter.

The converter includes: an input terminal connected with the first filter; and an output terminal connected with the second filter, and at least one choke inductor is connected to the output terminal. The choke inductor is spaced apart from the PE ground and/or the chassis ground more than 0.1 mm, preferably, more than 0.3 mm. When the choke inductor is spaced apart from the PE ground and/or the chassis ground more than 0.1 mm, it can prevent coupling to reduce switch noise caused by switch of the converter or the second converter. Here, the coupling means a phenomenon that signal energies emitted from neighboring lines are directly or indirectly flown into the opposite line.

The first filter includes a second capacitor of which one end is connected with the PE ground and the other end is connected with the chassis ground. The second capacitor is an Y capacitor, and the second capacitor has been described above in detail.

The first filter further includes an RC filter of which one end is connected with the second capacitor and the other end is connected with the chassis ground. The RC filter has been described above in detail.

Figure 10:
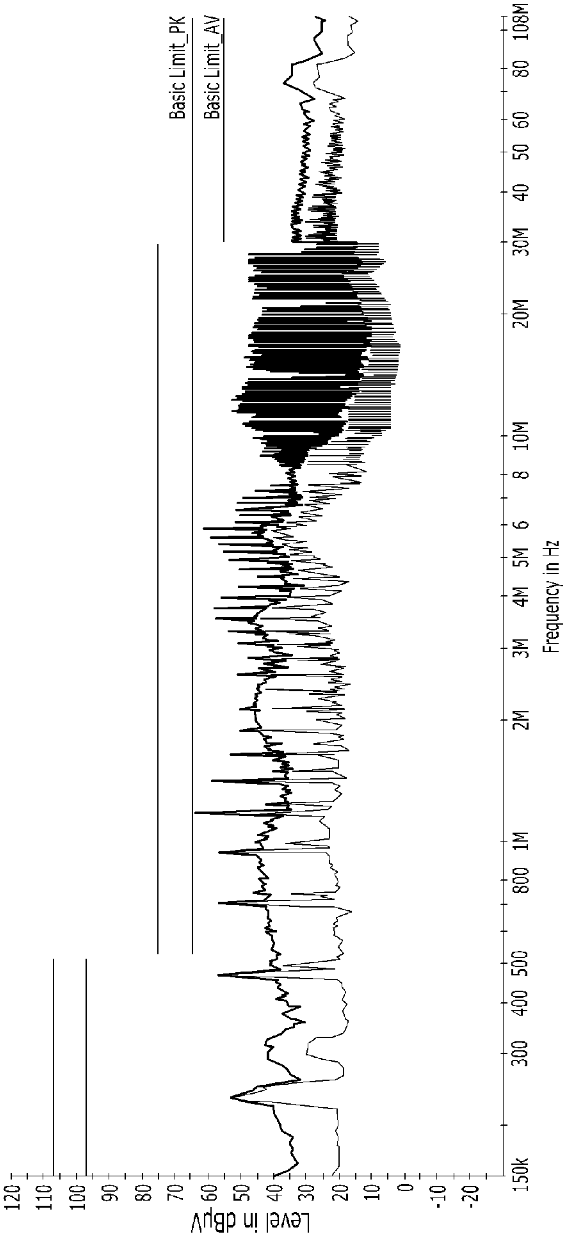
FIG. 10 is a graph showing an electro-magnetic interference conducted emission (EIM CE) noise of a conventional power supply device.
Figure 11:
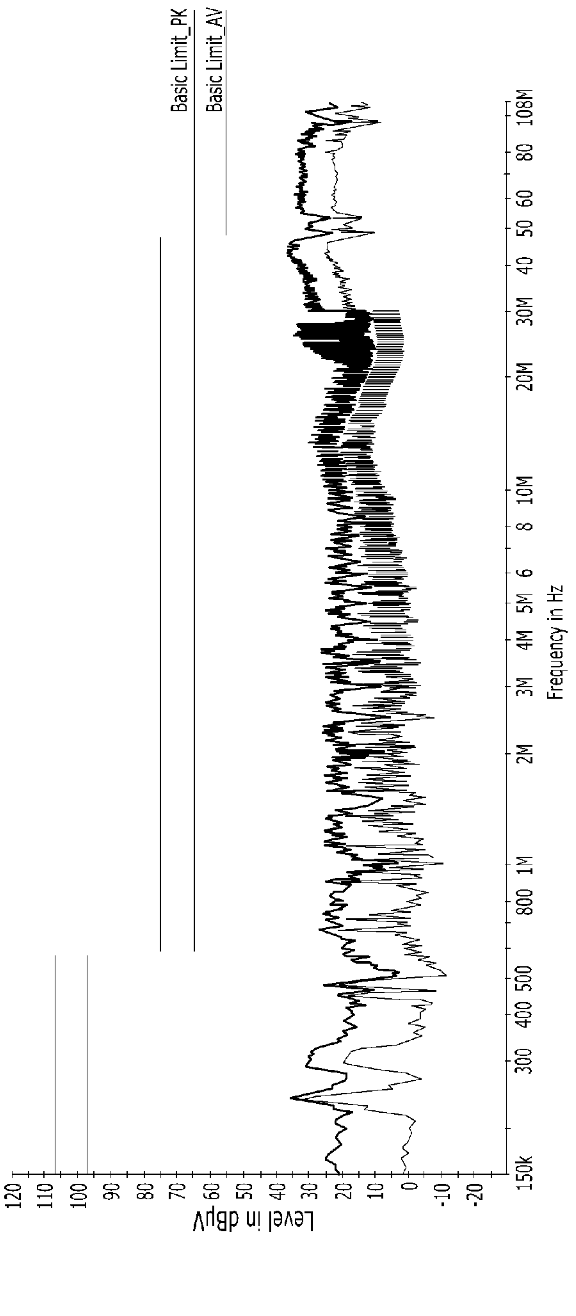
FIG. 11 is a graph showing an electro-magnetic interference conducted emission (EIM CE) noise of the power supply device according to the present invention.

FIG. 10 is a graph showing an electro-magnetic interference conducted emission (EIM CE) noise of a conventional power supply device. FIG. 11 is a graph showing an electro-magnetic interference conducted emission (EIM CE) noise of the power supply device according to the present invention.

The conducted emission (CE) is noise that electromagnetic waves are transmitted through a medium, such as a signal line or a power line. Comparing FIG. 10 with FIG. 11, you can see that a noise level by frequency bands of FIG. 11 is lower than that of FIG. 10.

In the drawings, a green graph is an average value of noise values according to frequencies, and a blue graph is a peak noise value according to frequencies. Especially, the peak noise value has been improved.

Figure 12:
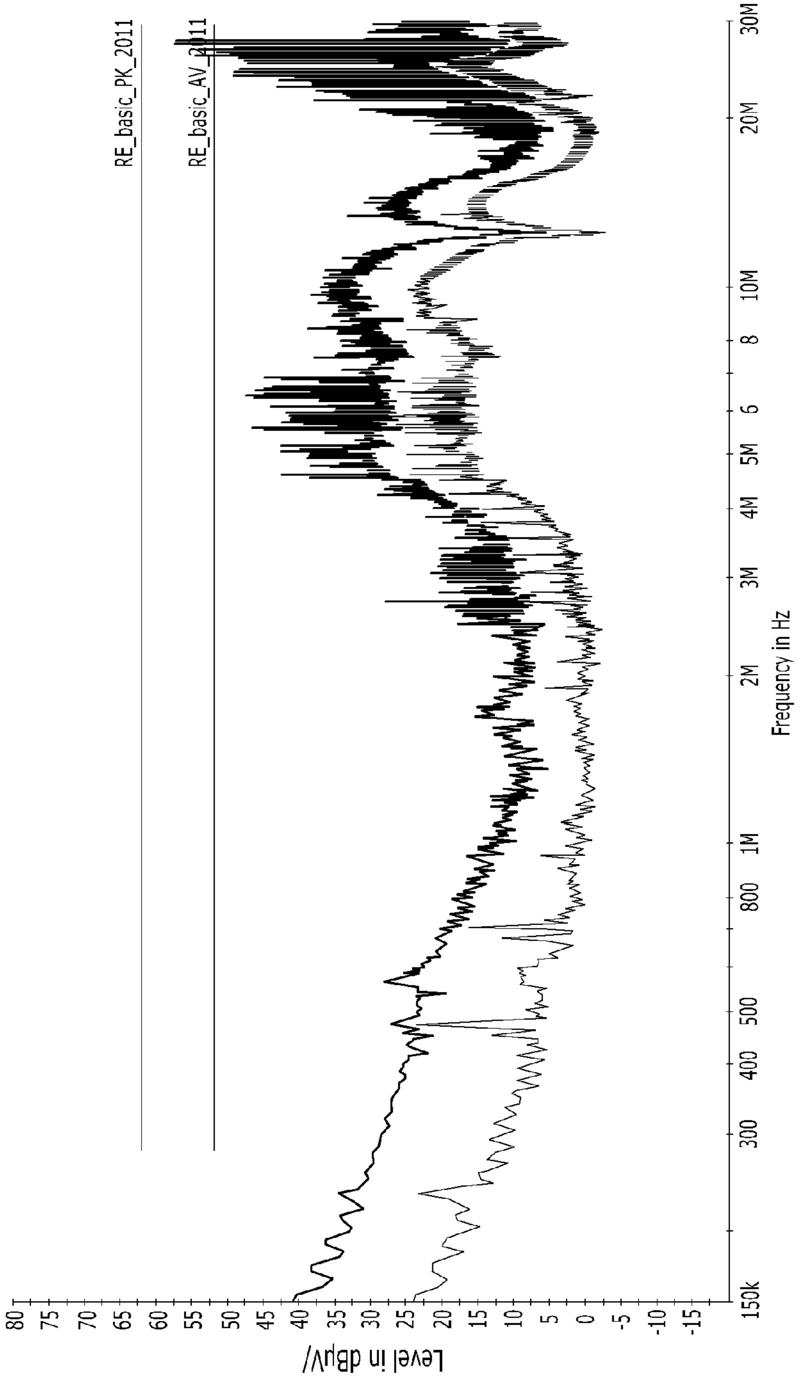
FIG. 12 is a graph showing an electro-magnetic interference radiated emission (EMI RE) noise of the conventional power supply device.
Figure 13:
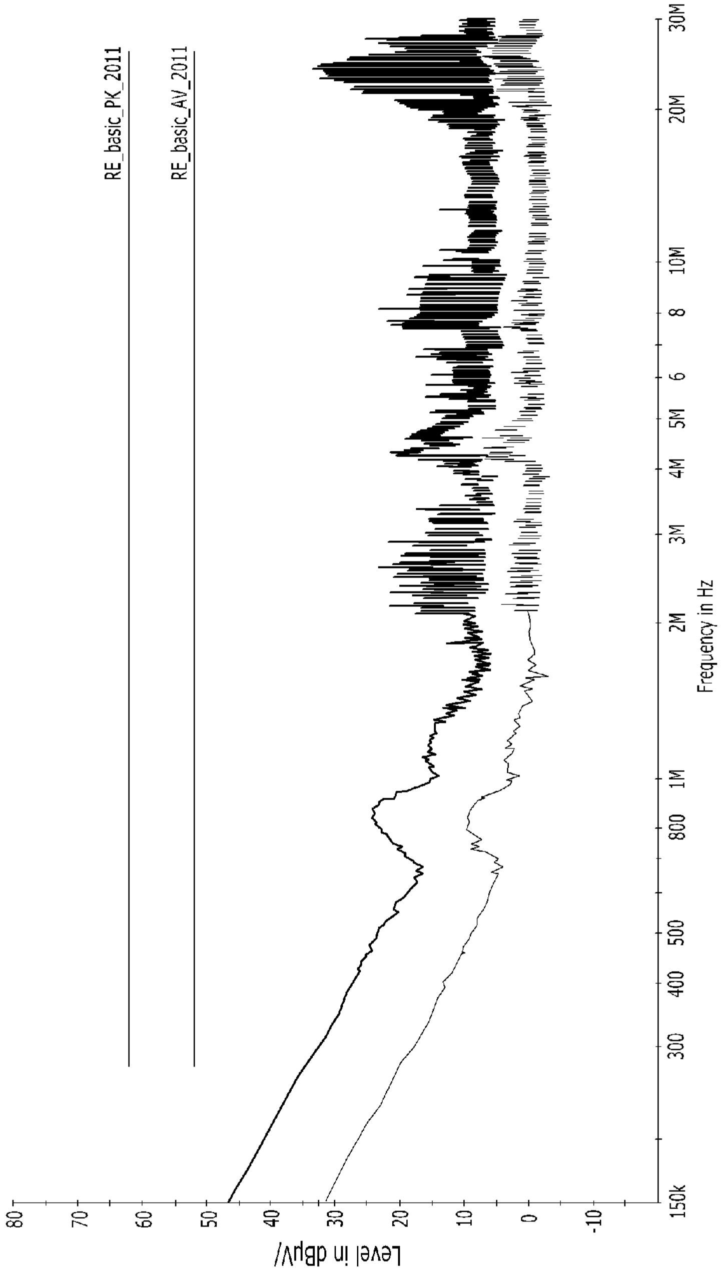
FIG. 13 is a graph showing an electro-magnetic interference radiated emission (EMI RE) noise of the power supply device according to the present invention.

FIG. 12 is a graph showing an electro-magnetic interference radiated emission (EMI RE) noise of the conventional power supply device. FIG. 13 is a graph showing an electro-magnetic interference radiated emission (EMI RE) noise of the power supply device according to the present invention.

The radiated emission (RE) is electromagnetic noise radiated and transmitted through the air.

Comparing FIG. 12 with FIG. 13, you can see that a noise level by frequency bands of FIG. 13 is lower than that of FIG. 12. All of the average value of the noise values and the peak noise value have been improved.

As described above, the terms used in the description of the present invention are intended to merely describe specific embodiments, but not intended to limit the invention. Therefore, it would be appreciated to those skilled in the art that various modifications, additions and substitutions are possible, without departing from the scope and spirit of the invention.

Accordingly, the protective scope of the present invention must be determined by the spirit of the appended claims, and it is to be construed that the present invention includes all the changes, equivalents, and substitutions which are defined in the appending claims.

EXPLANATION OF REFERENCE NUMERALS

10: power supply device or power supply circuit
20: PE ground
30: Chassis ground
40: Switch
50: Micro controller unit
70: Electric vehicle communication controller (EVCC)
80: Electric vehicle
90: Electric vehicle supply equipment (EVSE)
100: Battery
110: ECU
200: Common mode filter unit (CM filter unit)
210: First capacitor
211: First X capacitor
212: Second X capacitor
220: Second capacitor
221: First Y capacitor
222: Second Y capacitor
230: CM core
240: RC filter
250: DC block capacitor
300: Converter
320: Second converter
400: Differential mode filter unit (DM filter unit)
500: Chassis
510: PE ground area
520: Chassis ground area
610: Insulation layer
620: First layer
630: Second layer
640: Ground layer
641: PE ground
642: Chassis ground
650: Chassis electrode
651: First penetration electrode
652: Second penetration electrode
660: Third layer
670: Fourth layer
1000: Connector
1100: CP port
1200: PD port
1300: PE port
1400: power input port

The invention claimed is:

1. A power supply device comprising:

a common mode (CM) filter unit having a first capacitor of which one end is connected to a positive (+) terminal of a battery and the other end is connected with a potential earth (PE) ground of an electric vehicle supply equipment (EVSE) of an electric vehicle; and a differential mode (DM) filter unit having an inductor and a third capacitor, wherein an end of the third capacitor is connected with the PE ground.

2. The power supply device according to claim 1, wherein the first capacitor includes a first X capacitor and a second X capacitor, and wherein the CM filter unit includes a CM core located between the first X capacitor and the second X capacitor.

3. The power supply device according to claim 2, wherein the common mode filter unit further includes a DC block capacitor of which one end is connected to the positive (+) terminal of the battery and the other end is connected with the PE ground.

4. The power supply device according to claim 2, wherein the second X capacitor is spaced apart from the converter at an interval of 1 mm to 5 mm.

5. The power supply device according to claim 1, wherein the common mode filter unit further includes:

a second capacitor of which one end is connected to the other end of the first capacitor and the other end is connected with a chassis ground grounded to a chassis of the electric vehicle.

6. The power supply device according to claim 5, wherein the first capacitor includes a first X capacitor and a second X capacitor, wherein the second capacitor includes a first Y capacitor of which one end is connected to one end of the first X capacitor and the other end is connected with the chassis ground and a second Y capacitor of which one end is connected to the other end of the second X capacitor and the other end is connected with the chassis ground, and wherein the CM filter unit includes: a CM core located between the first X capacitor and the second X capacitor; and an RC filter of which one end is connected to the other end of the first Y capacitor and the other end is connected with the chassis ground.

7. The power supply device according to claim 6, further comprising:

an RC filter having a resistance and a capacitor to emit noise to the ground.

8. The power supply device according to claim 5, further comprising:

a second layer having a power line;

a ground layer having a PE ground and a chassis ground;

a first penetration electrode for connecting the PE ground and the second layer with each other;

a second penetration electrode for connecting the chassis ground and the second layer with each other; and a circuit board having a chassis electrode for connecting the chassis ground and a chassis case with each other, wherein one area of the second layer connected with the PE ground through the first penetration electrode and another area of the second layer connected with the chassis ground are insulated electrically, wherein the common mode filter unit and the differential mode filter unit are arranged on the second layer.

9. The power supply device according to claim 8, wherein the ground layer is one layer.

10. The power supply device according to claim 8, wherein the ground layer includes a third layer having the PE ground and a fourth layer having the chassis ground.

11. The power supply device according to claim 1, wherein the common mode filter unit goes by the way of a converter and is connected with the DM filter.

12. The power supply device according to claim 11, wherein the inductor of the differential mode (DM) filter unit is connected to an output terminal of the converter, and the other end of the third capacitor is connected to the inductor.

13. The power supply device according to claim 11, further comprising:

a second converter connected with the DM filter, wherein a positive (+) line of an output terminal of the second converter is spaced apart from the chassis ground and/or the PE ground more than 0.3 mm.

14. An electric vehicle communication controller (EVCC) for charging a battery of an electric vehicle comprising:

a connector connected with a charging station of the electric vehicle; and a power supply circuit for supplying actuating power to the EVCC, wherein the connector includes:

a power input port;

a control pilot (CP) port for receiving a control pilot signal; and a potential earth (PE) port connected with a potential earth (PE) ground of the charging station of the electric vehicle, wherein the power supply circuit includes:

a power input terminal to which an electric signal is applied;

a first filter for removing common mode noise of the electric signal; and a second filter for removing differential mode noise of the electric signal, and wherein the first filter is connected with the chassis ground of the electric vehicle, and the second filter is connected with the potential earth (PE) ground.

15. The electric vehicle communication controller (EVCC) according to claim 14, further comprising:

a converter for converting voltage of an electric signal outputted from the first filter, wherein the electric signal is inputted to the second filter.

16. The electric vehicle communication controller (EVCC) according to claim 15, wherein the converter includes an input terminal connected with the first filter and an output terminal connected with the second filter, wherein at least one choke inductor is connected to the output terminal, and wherein the choke inductor is spaced apart from the PE ground and/or the chassis ground more than 0.3 mm.

17. The electric vehicle communication controller (EVCC) according to claim 16, wherein the first filter includes a second capacitor of which one end is connected with the PE ground and the other end is connected with the chassis ground.

18. The electric vehicle communication controller (EVCC) according to claim 16, wherein the first filter further includes an RC filter of which one end is connected with the second capacitor and the other end is connected with the chassis ground.

* * * * *